METHODS FOR PRODUCING PRINTED CIRCUITS

Filed Nov. 27, 1963

INVENTOR
JOHN S. STROBEL
BY [signature]
ATTORNEY

United States Patent Office 3,320,657
Patented May 23, 1967

3,320,657
METHODS FOR PRODUCING PRINTED CIRCUITS

John S. Strobel, Nashua, N.H., assignor to Sanders Associates, Inc., Nashua, N.H., a corporation of Delaware Filed Nov. 27, 1963, Ser. No. 326,627
4 Claims. (Cl. 29—155.5)

This invention relates to printed circuits and methods for producing same. More particularly, it contemplates an improved resist for use in fabricating printed circuits, which resist need not be removed after etching, as in all other printed circuit processes, and in which the resist acts as the soldering flux when solder coating the circuit or soldering components to the circuit.

Among the objects of this invention are:

To provide new printed circuits and methods for producing same, which circuits lend themselves particularly to automation, and yielding improved edge definition in etched patterns;

To provide a process for making such circuits which can be operated at high speeds;

To provide an improved resist which reduces undercutting of conductors during etching, reduces or eliminates pinholes and scratches in the resist;

To provide a resist which acts as the soldering flux during attachment of components to the circuit;

To provide a method of making such circuits in which the ink establishing the pattern is used as an etching resist and as a soldering flux in addition to providing a protective coating for said pattern;

To provide a method of making such circuits in which the ink establishing the pattern is used, not as an etching resist, but only to establish the pattern, while the resist is formed by the fused thermoplastic rosin-based powder which adheres to the ink.

Still other object and advantages of my invention will be apparent from the specification.

Figure 1:
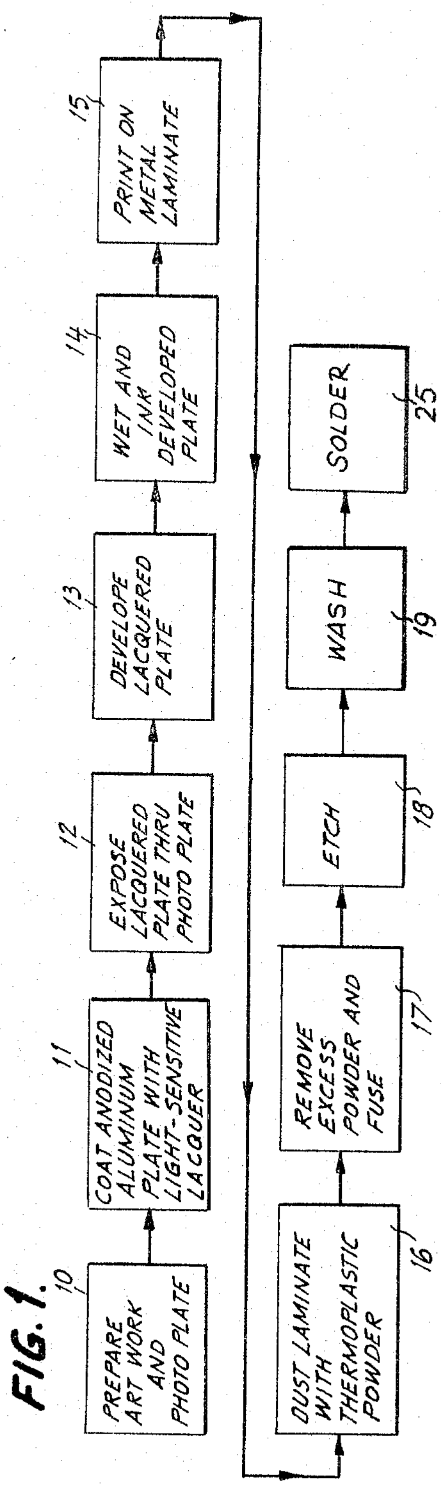
Figure 2:
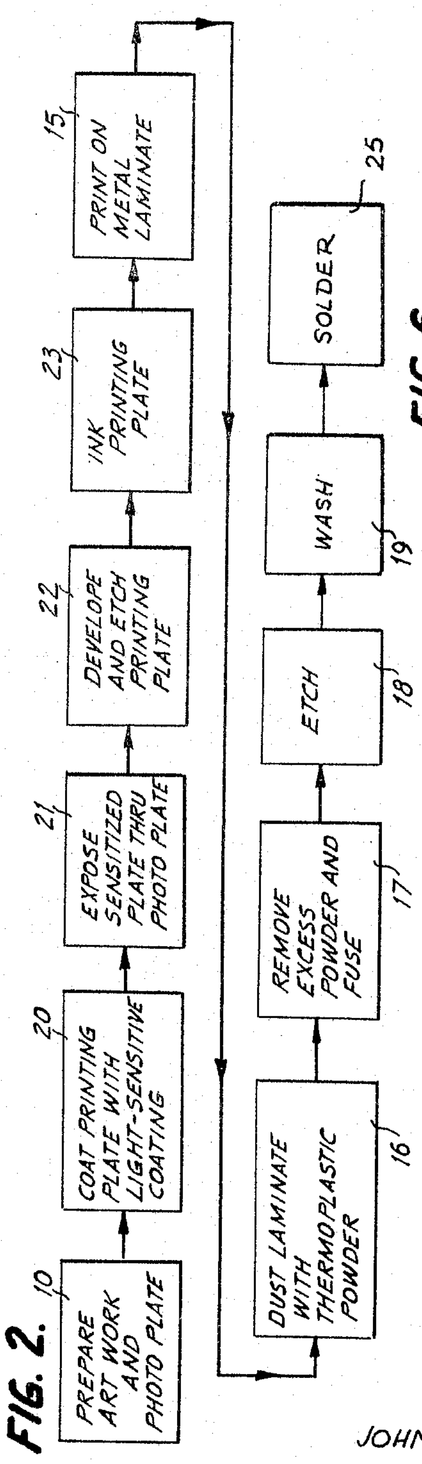
Figures 3, 4, 5, 6:
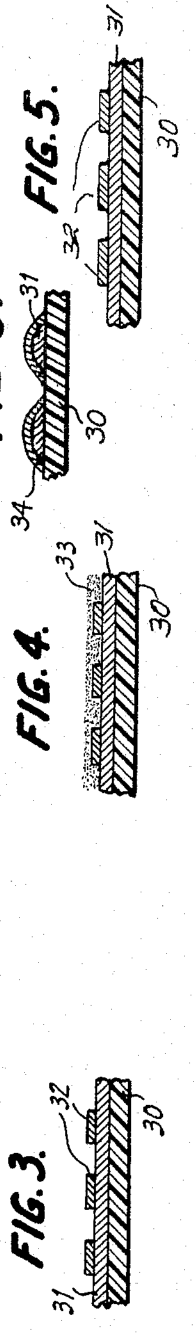

The features of novelty which I believe to be characteristic of my invention are set forth with particularity in the appended claims. My invention itself, however, both as to its fundamental principles and as to its particular embodiments, will best be understood by reference to the specification and accompanying drawing, in which FIG. 1 is a flow diagram showing the steps employed in making a printed circuit in accordance with one embodiment of my invention, FIG. 2 is a similar diagram of an alternate process according to my invention, FIG. 3 is a sectional view, enlarged for clarity, of a laminate after printing of the circuit image, FIG. 4 is a similar view after dusting with powder as described herein, FIG. 5 is a similar view after removing the excess powder, firing, and the beginning of etching, and FIG. 6 is a similar view after etching showing the extrusion of the resist and its protective action.

Basically, this invention contemplates printing on the copper surface to be etched an ink pattern of the circuit to be formed by any one of several press methods. In one embodiment, the wet ink pattern is then dusted with a thermoplastic powder. In this example, the printing is done with rosin-based ink and a thermoplastic rosin-based powder is applied to the wet ink.

After sufficient powder has adhered to the inked surface, due to tackiness of the inked pattern, the excess is blown and/or vacuumed off, and the adhering powder is heated by a heat source such as a hot air blast or other suitable means to form the resist pattern. The powder is fused by the application of heat and flows to cover the entire circuit pattern, thereby forming an excellent etching resist.

Then the exposed copper is etched away preferably using a hot spray etch or in the usual manner known to the art.

The process is illustrated in the flow chart, FIG. 1, which can be used for flexible base laminated circuits, wherein 10 represents the steps of preparing the art work, usually in the form of an enlarged black on white representation of the circuit to be made, photographing the art work, and preparing a photographic negative, usually reduced to the size of the circuit desired. In some cases it may be desired to produce a photographic positive, and this may be done.

Printing of the circuit image is preferably done by the offset printing method. The printing plates which carry the image of the circuit are preferably anodized aluminum of the order of 0.015" thick, which have been coated with light-sensitive lacquer, as shown in step 11, exposed through a photographic negative of the circuit, step 12, and developed, step 13.

After development, the non-pattern (non-circuit) areas attract water and repel ink. In use, after development, the plate is first wetted (in non-pattern areas) and then inked, step 14, the ink being picked up only by the lacquered pattern (circuit) areas.

The circuit pattern is then printed, preferably by the offset process, on the flexible copper laminate, the copper having been degreased but not scoured, step 15. In such a process, as will be understood, the printing plates never touch the surface to be printed, the ink pattern being picked up by a rubber or like transfer roller and applied to the surface to be printed. This promotes long life of the plates.

The printed laminate is shown in enlarged section in FIG. 3 in which 30 is the insulation, 31 the layer of copper carried thereby, and 32 the ink deposited on the copper surface.

After the printed image has been transferred to the metal surface 31, the surface is dusted with thermoplastic rosin-based powder, step 16, and after the powder has adhered to the printed image, the excess powder is blown away, or otherwise removed. The powder is then fired under heat lamps or other suitable heat source, step 17. This fuses the thermoplastic powder and ink to the metal to form the resist pattern. Etching may then be done, step 18, in the usual way. It will, of course, be understood that the powder adheres only in the inked pattern areas of the circuit to be formed, leaving the other areas clean after the excess powder has been removed.

FIG. 4 shows the circuit board after the thermoplastic powder 33, indicated by dots, has been dusted on the image surface, and before the excess powder has been removed. FIG. 5 shows the board after the excess powder has been removed, the image heat-fused, and etching begun.

FIG. 6 shows the circuit board after the thermoplastic powder 33 has been fused by suitable heat source. It is to be noted that the fused image after being acted on by a heat etched spray extrudes to protect the sides of the etched pattern, thereby preventing undercutting. This provides an accurate circuit pattern with improved adhesion to the bare laminate and prevents over-etching due to prolonged exposure to the etchant. The etched board is then washed, step 19. In step 25, the entire circuit pattern covered with the rosin-based resist can be solder coated and/or components attached.

An alternative to the process, which may be used on both rigid and flexible circuits, is the use of platen or letter press techniques in the printing process. This is illustrated in flow chart of FIG. 2. In this instance, it will be understood, the printing plate is etched so that noncircuit areas are separated from the ink rollers, and do not pick up ink. In this modification of the invention, like reference numerals indicate like steps as in FIG. 1.

Step 20 indicates coating the printing plate, which in this instance does not have to be anodized aluminum, but may be coated with a light-sensitive coating (Du Pont Dycril), exposed as in step 21, developed and etched, step 22, and inked, step 23.

Certain precautions should be taken in practicing my invention. The ink to be used in the press to make the "first" impression is critical in that it must be tacky to trap the thermoplastic powder to form the resist, and it must, after etching, be easily removable. Some inks work well in trapping the powder, but are almost impossible to remove after fusing and etching or they may inhibit solder flow. Of the various inks tried, an Overprint Varnish type appears to be satisfactory. It has been noted that one great advantage of my process, other than its speed, is that the resist, being thermoplastic, extrudes around the conductor during etching and thereby reduces undercutting as shown in FIG. 6.

Since etchants known to the art are generally acidic in character, the resultant resist must have sufficient acid resistance: Where other etchants having different characteristics are utilized, such as alkaline etching of aluminum, the resist material chosen should be resistant to whatever etchant is being used.

The process of my invention may be used to provide printing circuits both on flexible and hard circuit boards. It also can be used on rigid boards, run on a platen press, where the printing plate is likely to be damaged by bumps and nicks in the copper surface of the laminate, and it may be desirable to use a semi-flexible material (as in a rubber stamp) for the printing plate. I have found that the best material for use in such printing plates is a photosensitive plastic.

Using flexible base laminate, I have found that offset printing is preferable to sheet feeding on either flat-bed or rotary letter presses, because of the frequency of wrinkled stock. If used against a rigid printing plate, this is likely to cause failure of the plate due to crushing, whereas, in offset printing, the rubber blanket used will not only absorb these wrinkles but has been observed to print over them.

The thermoplastic powder should be free-flowing and may be a modified grade of gum rosin. It preferably should have a sharp melting point. I have found that a thermoplastic powder having a melting point of about 110° C. operated satisfactorily although powder having different melting points can be satisfactorily utilized. To trap enough powder and to allow soldering without removal of resist, it is important to select a suitable ink. As already stated, inks of the "overprint varnish" type have appeared superior to others in my tests. These inks are solvent-based and do not polymerize, so the resist is more easily removable after etching (important in the use of flexible circuit boards), and is more easily applied using offset press techniques. The ink may be a mixture of gum rosin with a low-volatility solvent, such as Naptha VM&P (a thickener), and a thixotropic agent. Naptha VM and P refers to any of a number of narrow-boiling-range fractions of petroleum with pointing points of about 200°–300° F. The solvents used must be compatible with both the inking rollers on the press and with the printing plate used.

An alternative process is to combine the rosin or some other suitable flux with the ink and print a pattern directly on the metal to be etched, then etching directly without further treatment. Therefore, this process would be similar to either FIG. 1 or FIG. 2 with steps 16 and 17 eliminated in each case. The rosin based ink should have the same characteristics as stated above except it should not be tacky when dried.

Two real advantages of my process may be noted here. These are the elimination of pinholes and the improved edge definition after etching. Pinholes are closed, even if they appear in the printed pattern, apparently because the surface tension of the fused powder, when molten, is low enough to permit flow to close the pinhole area. The etched pattern is improved because the fused resist, being thermoplastic, tends to extrude around the edges of the conductor during etching (when etching of the hot spray type is used), due to the impact of the hot etchant solution on the surface of the resist.

Measurement of etched lines indicates no undercutting, but rather a smooth curve starting at the edge of the printed pattern and flowing smoothly to the plastic surface as already explained in connection with FIG. 6. Measurements indicate that line widths increase by 3 mils per edge because of this when etching 2 ounce copper circuits. To compensate for this, the art work should be such as to give the final width desired. For instance if a conductor width of 0.030" is desired, the art work should be 0.025" to 0.030".

While I have described the process utilizing rosin-based ink as a preferred embodiment of the invention, it is to be understood that anysuitable material such as glutamic acid or stearic acid derivatives having the required properties and characteristics can be used in carrying out my invention. Also, in the foregoing, I have described certain preferred embodiments of my invention, and the best mode presently known to me for practicing the same, but it will be understood that modifications and changes may be made without departing from the spirit and scope of my invention, as will be clear to those skilled in the art.

What is claimed is:

1. The method of producing a printed circuit comprising the steps of:

(a) printing a representation of a circuit to be produced with tacky ink upon the etchable metallic surface of a laminate by means of an offset printing plate carrying said representation, (b) dusting the printed surface with a rosin-based thermoplastic powder forming, after heating, a soldering flux adherent to the inked representation, (c) removing the excess powder, (d) heat fusing the adherent powder to form a resist to protect the metal of the circuit to be formed by etching, and (e) applying an etchant having a sufficient temperature to cause the exposed metallic surface to be removed and so soften the resist such that it will extrude around the circuit to be produced, thus preventing undercutting of the remaining metallic surface of the circuit.

2. The method of producing a printed circuit which includes the steps of:

(a) printing a representation of a circuit to be produced upon the etchable metallic surface of a laminate in a medium absorbent to a thermoplastic powder forming a soldering flux resist after firing by means of an offset printing plate carrying said representation, (b) dusting the printed surface with a rosin-based thermoplastic powder forming, after firing, a resist which will also function as a soldering flux, (c) removing the powder not adhering to the absorbent medium, (d) heat fusing the adherent powder to form a soldering resist pattern, (e) hot etching the exposed metallic surface with an etchant having a sufficient temperature to cause the exposed metallic surface to be removed and to soften the resist such that it will extrude around the circuit to be produced, thus preventing undercutting of the remaining metallic surface of the circuit, and (f) soldering components to said remaining metal while said resist is still in place.

3. The method of producing a printed circuit which includes the steps of:

(a) printing a representation of the circuit to be produced upon the etchable metallic surface of a laminate, in a medium absorbent to a thermoplastic acid-proof powder forming a soldering flux resist after firing, (b) dusting the printed surface with a thermoplastic rosin-based powder, (c) removing the excess powder, (d) heat firing the adherent powder to form a soldering flux resist, (e) hot etching the exposed metallic surface with an etchant having a sufficient temperature to cause the exposed metallic surface to be removed and to soften the resist such that it will extrude around the circuit to be produced, thus preventing undercutting of the remaining metallic surface of the circuit, and (f) soldering components to said remaining metal while said resist is still in place.

4. The method of producing a printed circuit which includes the steps of:

(a) printing a representation of the circuit to be produced, upon the etchable metallic surface of a laminate, in a medium absorbent to a thermoplastic acid-proof powder forming a soldering flux after heating, (b) dusting the printed surface with a thermoplastic rosin-based powder, (c) removing the excess powder, (d) heat fusing the powder to form an acid-proof resist, and (e) hot spray etching the exposed metallic surface with an etchant having a sufficient temperature to cause the exposed metallic surface to be removed and to soften the resist such that it will extrude around the circuit to be produced, thus preventing undercutting of the remaining metallic surface of the circuit.

References Cited by the Examiner

UNITED STATES PATENTS

| | | | |
|---|---|---|---|
| 2,602,731 | 7/1952 | Nierenberg | 156—3 |
| 2,692,190 | 10/1954 | Pritikin | 156—233 X |
| 2,777,192 | 1/1957 | Albright et al. | 29—155.5 |
| 2,822,635 | 2/1958 | Mears | 156—8 |
| 2,830,918 | 4/1958 | Zimmerman | 117—98 X |
| 2,861,029 | 11/1958 | Bain et al. | 156—11 X |
| 3,008,409 | 11/1961 | Wentworth et al. | 156—13 X |

ALEXANDER WYMAN, *Primary Examiner.*

W. A. POWELL, *Assistant Examiner.*